United States Patent
Suzuki et al.

(10) Patent No.: US 9,354,285 B2
(45) Date of Patent: May 31, 2016

(54) MAGNETIC MEASUREMENT DEVICE

(71) Applicant: TDK CORPORATION, Tokyo (JP)

(72) Inventors: Kenichi Suzuki, Tokyo (JP); Tsutomu Chikamatsu, Tokyo (JP); Akio Ogawa, Tokyo (JP); Kyung-ku Choi, Tokyo (JP); Ryuji Hashimoto, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 14/374,786

(22) PCT Filed: Dec. 13, 2012

(86) PCT No.: PCT/JP2012/082277
§ 371 (c)(1),
(2) Date: Jul. 25, 2014

(87) PCT Pub. No.: WO2013/111468
PCT Pub. Date: Aug. 1, 2013

(65) Prior Publication Data
US 2015/0070005 A1    Mar. 12, 2015

(30) Foreign Application Priority Data
Jan. 26, 2012 (JP) ................................. 2012-014551

(51) Int. Cl.
*G01R 33/12* (2006.01)
*G01R 33/10* (2006.01)

(52) U.S. Cl.
CPC ............... *G01R 33/12* (2013.01); *G01R 33/10* (2013.01); *G01R 33/1215* (2013.01)

(58) Field of Classification Search
CPC ..... G01R 33/12; G01R 33/1215; G01R 33/10
USPC ........................................................ 324/232
See application file for complete search history.

(56) References Cited

U.S. PATENT DOCUMENTS 3,490,033 A * 1/1970 Elarde ........................ 324/222
(Continued)

FOREIGN PATENT DOCUMENTS

JP    A-6-180304    6/1994
(Continued)

OTHER PUBLICATIONS

Written Opinion of the International Searching Authority issued in International Patent Application No. PCT/JP2012/082277 mailed Feb. 26, 2013.
Sep. 28, 2015 Search Report issued in European Application No. 12866665.8.

*Primary Examiner* — Melissa Koval
*Assistant Examiner* — Courtney McDonnough
(74) *Attorney, Agent, or Firm* — Oliff PLC

(57) ABSTRACT

A magnetic measurement device which measures coercivity and coercivity distribution in a microregion of a thin plate magnetic sample with high coercivity. A magnetic sample is applied with a magnetic field in a first direction and magnetized, a second magnetic field is applied in a direction opposite to the first, a measuring part scans the sample, measuring magnetic flux leakage due to remnant magnetization in the sample. The intensity of the second magnetic field is gradually increased while the measuring part repeats the measurement to obtain the second magnetic field wherein the magnitude of the leakage from the sample reaches the maximum level, and when a magnetic field equivalent to the coercivity is applied to the sample and about half of the magnetization is reversed, the sample's coercivity is obtained based on the determination that the demagnetizing field Hd reaches the minimum level and the leakage reaches the maximum level.

4 Claims, 4 Drawing Sheets

(56) References Cited

U.S. PATENT DOCUMENTS

| | | | |
|---|---|---|---|
| 2006/0250129 A1* | 11/2006 | Wu | G01R 33/14 324/228 |
| 2008/0284422 A1 | 11/2008 | Ishio et al. | |
| 2010/0109468 A1 | 5/2010 | Natsumeda et al. | |

FOREIGN PATENT DOCUMENTS

| | | |
|---|---|---|
| JP | A-9-7133 | 1/1997 |
| JP | A-2001-141701 | 5/2001 |
| JP | A-2006-17557 | 1/2006 |
| WO | WO 2008/123251 A1 | 10/2008 |

* cited by examiner

MAGNETIC MEASUREMENT DEVICE

The present invention relates to a magnetic measurement device for measuring the magnetic characteristics especially the coercivity of a magnetic sample by the measurement of the magnetic flux leakage due to the remanent magnetization.

BACKGROUND

Recently, for energy saving, the permanent magnet used in various motors employed in HEV (the hybrid electrical vehicle) or the home appliance is required to be a magnet with high performance. Specially, in order to deal with the working environment at a high temperature, it is required that the magnet should be excellent in heat resistance and has a high coercivity. As a permanent magnet with high performance which has a high coercivity, a permanent magnet formed by adding Dy or Tb in the Nd—Fe—B based magnet is known, however, the use of Dy or Tb is not preferable for resource saving.

Therefore, is order to maximally lower the used amount of Dy or Tb, a magnet is proposed in which only the coercivity at the part affected by large demagnetizing field is increased, and which is the so called structure with the distribution of the coercivity (Patent Document 1).

In order to evaluate a sample in which the coercivity distributed in the magnetic substance is uneven, a device for measuring the coercivity in a microregion of a submillimeter level or less is needed.

So far, a B-H curve tracer or a VSM (vibrating sample magneto-meter) has been used in measuring the magnetic characteristics of the magnetic sample. However, these measurement devices can only measure the average magnetic characteristics of the magnetic sample which is the object to be measured, and cannot measure the distribution of the coercivity, i.e., the coercivity in a microregion.

A method is also considered in which the magnetic sample which is the object to be measured is divided by cutting process or the like and measured by a VSM or the like so that the coercivity in a microregion is measured. However, the inherent coercivity of the magnetic sample cannot be measured due to the damage to the surface layer of the magnetic sample caused by the process.

In order to measure the coercivity in a microregion of a magnetic sample without processing the magnetic sample, a MFM (magnetic force microscopy) is used.

In order to measure the coercivity in a microregion of the sample using a MFM, it is necessary to measure the magnetic sample in a magnetic field. However, as the measuring head is affected by the magnetic field in a magnetic field with a high intensity, the measurement cannot be performed, and it is difficult to evaluate the coercivity in a sample with a high coercivity as obtained by adding Dy or Tb mentioned above.

PATENT DOCUMENT

Patent Document 1: WO2008/123251
Patent Document 2: JP-A-2006-17557

Patent Document 2 has disclosed an analysis method which uses the magnetic force microscopy for the coercivity distribution in the perpendicular magnetic recording medium and an analysis device thereof, and the magnetic flux corresponding to the magnetic flux leakage generated from the magnetic domain on the surface of the sample is measured in a state where a magnetic field substantially perpendicular to the sample is applied. However, in a case where a magnetic field with a high intensity is applied to the sample, as the magnetization state of the measuring head changes, it is difficult to perform the measurement of the measuring head and the coercivity of the sample cannot be evaluated.

SUMMARY

The present invention has been made in view of such situation, and it is an object of the present invention to provide a magnetic measurement device which can evaluate the coercivity of a sample with a high coercivity without applying a magnetic field to the measuring part which measures the magnetic flux leakage of the magnetic sample.

One aspect of the present invention provides a magnetic measurement device for measuring the coercivity of a magnetic sample, wherein the magnetic measurement device comprises a first magnetic field generating part which applies an external magnetic field to the magnetic sample in a first direction and performs a magnetization to substantial saturation, a second magnetic field generating part which applies a magnetic field to the magnetic sample in a opposite direction opposite to the first direction and performs a demagnetization, a measuring part which measures the magnetic flux leakage of the magnetic sample demagnetized by the second magnetic field, and a coercivity determining part which controls the actions of the first magnetic field generating part, the second magnetic field generating part and the measuring part, obtains the magnetic flux leakage when the magnitude of the magnetic field in the opposite direction is changed sequentially, and outputs the magnitude of the magnetic field as the coercivity of the magnetic sample when the magnetic flux leakage reaches the maximum level. As the demagnetized magnetic sample is measured by such a structure in the present invention, the measuring part will not be affected by the applied magnetic field in a case where a magnetic field is applied in the measurement. In addition, as the magnitude of the magnetic field from the second magnetic field generating part when the magnetic flux leakage of the magnetic sample reaches the maximum level is based and output as the coercivity of the magnetic sample, the remanent magnetization of the magnetic sample can be properly measured without being affected by the demagnetizing field.

In one aspect of the present invention, the first magnetic field generating part may also function as the second magnetic field generating part.

In one aspect of the present invention the second magnetic field generating part may apply as uniform magnetic field to the magnetic sample.

According to the present invention, with respect to a magnetic sample with a high coercivity (such as a magnet obtained by adding Dy or Tb in the Nd—Fe—B based magnet), the measuring part will not be magnetized by the external magnetic field and the measurement of the coercivity in a microregion become possible.

Figure 1:
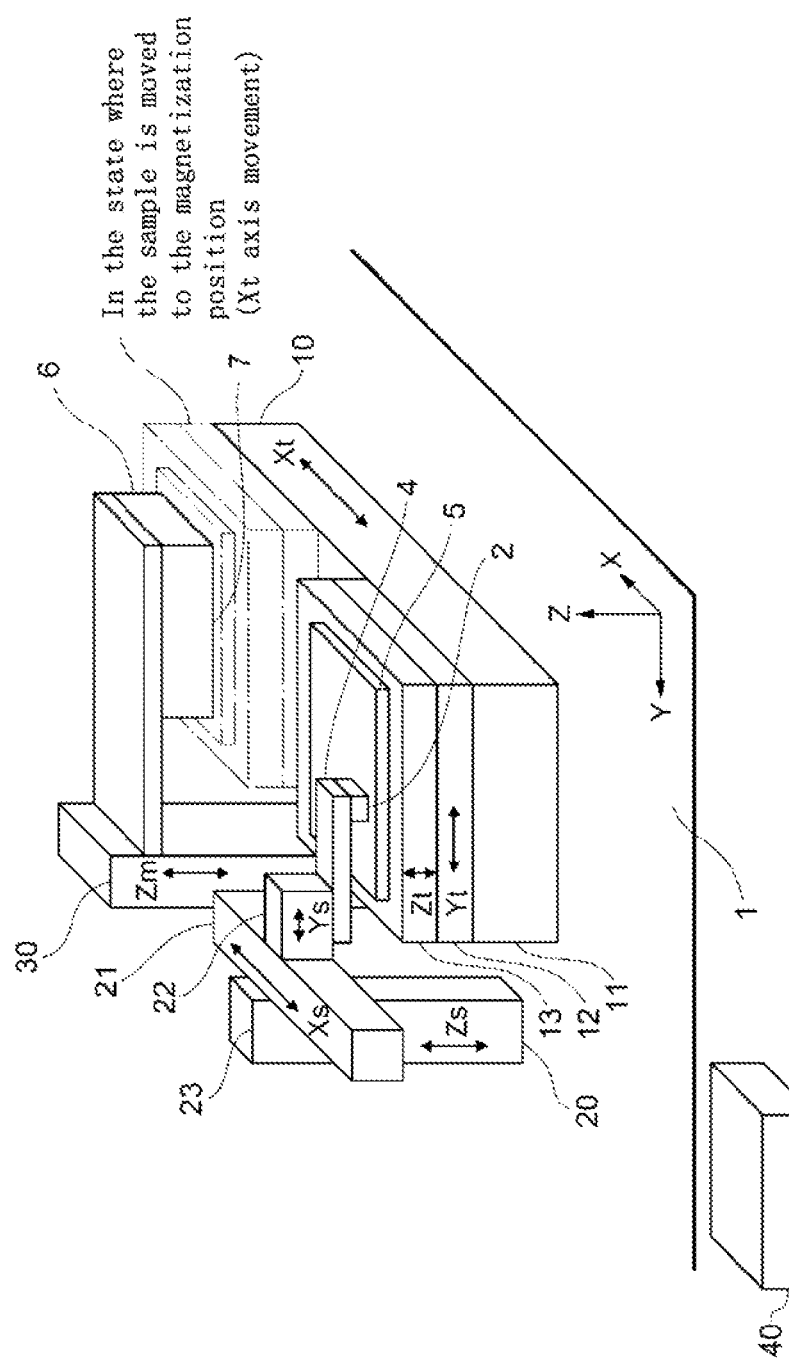
FIG. 1 is a schematic prospective view showing the measurement device of the present invention.

DESCRIPTION OF REFERENCE NUMERALS 1 base
2 measuring part
4 supporting arm
5 magnetic sample
6 magnetic field generating device
7 magnetic pole
10 XYZ platform
11 X platform
12 Y platform
13 Z platform
20 XYZ arm
21 X arm
22 Y arm
23 Z arm
30 Zm axis-driving system
40 control part

DETAILED DESCRIPTION OF EMBODIMENTS

Hereinafter, the preferable embodiments of the present invention will be described in detail with reference to the drawings. The same reference numeral is provided to the same or similar constituent element, means, treatment, etc., shown in the drawings, and the repeated descriptions can be properly omitted. In addition, these embodiments are exemplary and will not limit the present invention, and all the features disclosed in the embodiments or their combinations are not necessarily be limited to the substantial content in the present invention.

FIG. 1 is a schematic perspective view showing the whole structure of the magnetic measurement device of the present invention. In FIG. 1, a XYZ platform 10 which includes a X platform 11 which slides freely in the direction of the Xt axis (parallel to the X axis among the XYZ orthogonal three-axes), a Y platform 12 which is disposed on the X platform 11 and slides freely in the direction of the Yt axis (parallel to the Y axis among the XYZ orthogonal three-axes), and a Z platform 13 which is disposed on the Y platform 12 and slides freely in the direction of the Zt axis (parallel to the Z axis among the XYZ orthogonal three-axes) is disposed on a base 1, and a magnetic sample 5 with thin plate shape is positioned and fixed on the Z platform 13. In addition, the magnetic measurement device of the present invention includes a control part 40 which controls each part of the measurement device, performs determination on the base of the measured magnetic flux leakage, and calculates the coercivity and its distribution.

The magnetic sample which is the object to be measured of the present invention includes an rare earth based magnet such as the R-T-B based magnet and the R-T based magnet, an oxide based magnet such as the Ba ferrite magnet and the Sr ferrite magnet, and a soft magnetic substance which, unlike magnet, does not have high coercivity. In addition, in a case where the magnetization direction of the magnetic sample is perpendicular to the flat shape of the thin plate sample, the present invention can be achieved by a simple structure, and in a case where the magnetization direction is in-plane, the present invention effectively functions.

The XYZ platform 10 may be driven by a motor, and may also be driven by a piezoelectric actuator. The movement stroke of the XYZ platform 10 in the X and Y directions may be set to cover the measurement region of the sample. In this respect, the whole measurement region of the sample can be measured. The movement stroke of the XYZ platform 10 in the X and Y directions is, for example, 10×10 mm. The movement stroke of the XYZ platform 10 in the Z direction may be set to he larger enough than the thickness of the sample. Accordingly, the magnetic sample 5 can easily approach the measuring part 2 and the magnetic field generating part 6. In the present embodiment, the magnetic field-generating part 6 applies a magnetic field in a first direction via one magnetic pole 7 so as to perform the magnetization to substantial saturation, and applies a magnetic field in a direction opposite to the first direction to perform the demagnetization. Accordingly, in the present embodiment, the magnetic field-generating part 6 possesses both the first magnetic field-generating part and the second magnetic field-generating part, and alternatively, the first magnetic field-generating part and the second magnetic field-generating part can be separately disposed. The location resolution of the XYZ platform 10 in the X and Y directions may be smaller enough than the size of the magnetic domain of the magnetic sample 5. Therefore, the measurement of magnetic flux leakage in a microregion is possible. The location resolution in the X and Y directions may be, for example, 10 nm. The location resolution of the XYZ platform 10 in the Z direction may smaller enough than the surface roughness of the magnetic sample 5. As a result, the measurement of the magnetic flux leakage due to the remanent magnetization in the sample without being affected by the surface morphology is possible.

A Z arm 23 which slides freely in the direction of the Zs axis (parallel to the Z axis among the XYZ orthogonal three-axes) is vertically arranged and fixed on the base 1, a X arm 21 which slides freely in the direction of the Xs axis (parallel to the X axis among the XYZ orthogonal three-axes) is disposed in front of the Z arm 23, and a Y arm 22 which slides freely in the direction of the Ys axis (parallel to the Y axis among the XYZ orthogonal three-axes) is disposed in front of the X arm 21. The supporting arm 4 is arranged on the underside of the Y arm 22, and the measuring part 2 is disposed on the underside of the leading end of the supporting arm 4.

The XYZ arm 20 may be driven by a motor, and may also be driven by a piezoelectric actuator. The movement stroke of the XYZ arm 20 in the X and Y directions may be set to cover the measurement region of the sample. In this respect, the whole measurement area of the sample can be measured. The movement stroke of the XYZ arm 20 in the X and Y directions is, for example, 100×100 mm. The movement stroke of the XYZ arm 20 in the Z direction may be set to be larger enough than the thickness of the sample. Accordingly, the magnetic sample 5 can easily approach the measuring part 2. The location resolution of the XYZ arm 20 in the X and Y directions should be smaller enough than the size of the magnetic domain of the magnetic sample 5. Thereby, the measurement of the distribution of the magnetic field in a microregion is possible. The location resolution in the X and Y directions may be, for example, 10 nm. The location resolution of the XYZ arm 20 in the Z direction may be smaller enough than the surface roughness of the magnetic sample 5. As a result, the measurement of the magnetic flux leakage due to the remanent magnetization in the sample without the influence by the surface morphology is possible.

Although the XYZ platform 10 and the XYZ arm 20 are two structures that perform in the same action with respect to the relative position relationship between the magnetic sample 5 and the measuring part 2, by choosing different driving ways for each structure, the measurement of a microregion to a large sample can be performed in one device. For example, the XYZ platform 10 may be driven by a motor to perform coarse motions and the XYZ arm 20 may be driven by a piezoelectric actuator to perform micro motions. Thereby, the movement towards any position of the sample at a high speed can he done by the coarse motions, and the remanent magnetization in microregions can be specifically measured by the micro motions.

A Zm axis-driving system 30 which slides freely in the direction of the Zm axis (parallel to the Z axis among the XYZ orthogonal three-axes) is vertically arranged and fixed on the base 1, and the magnetic field generating part 6 is disposed in front of the Zm axis-driving system 30. In order to magnetize the magnetic sample 5 by the magnetic field generating part 6, the XYZ platform 10 is moved to the magnetization position (the position indicated by the dashed lines in FIG. 1) where the magnetic pole 7 which radiates the magnetic field from the magnetic field generating part 6 to the outside is opposite to the surface of the magnetic sample 5, and the magnetic pole 7 adequately approach the surface of the magnetic sample 5 through the Zm axis-driving system 30. Thereby, the magnetic sample 5 can be uniformly magnetized or can be magnetized in accordance with the pattern possessed by the magnetic pole 7 of the magnetic field generating part 6.

Figure 2:
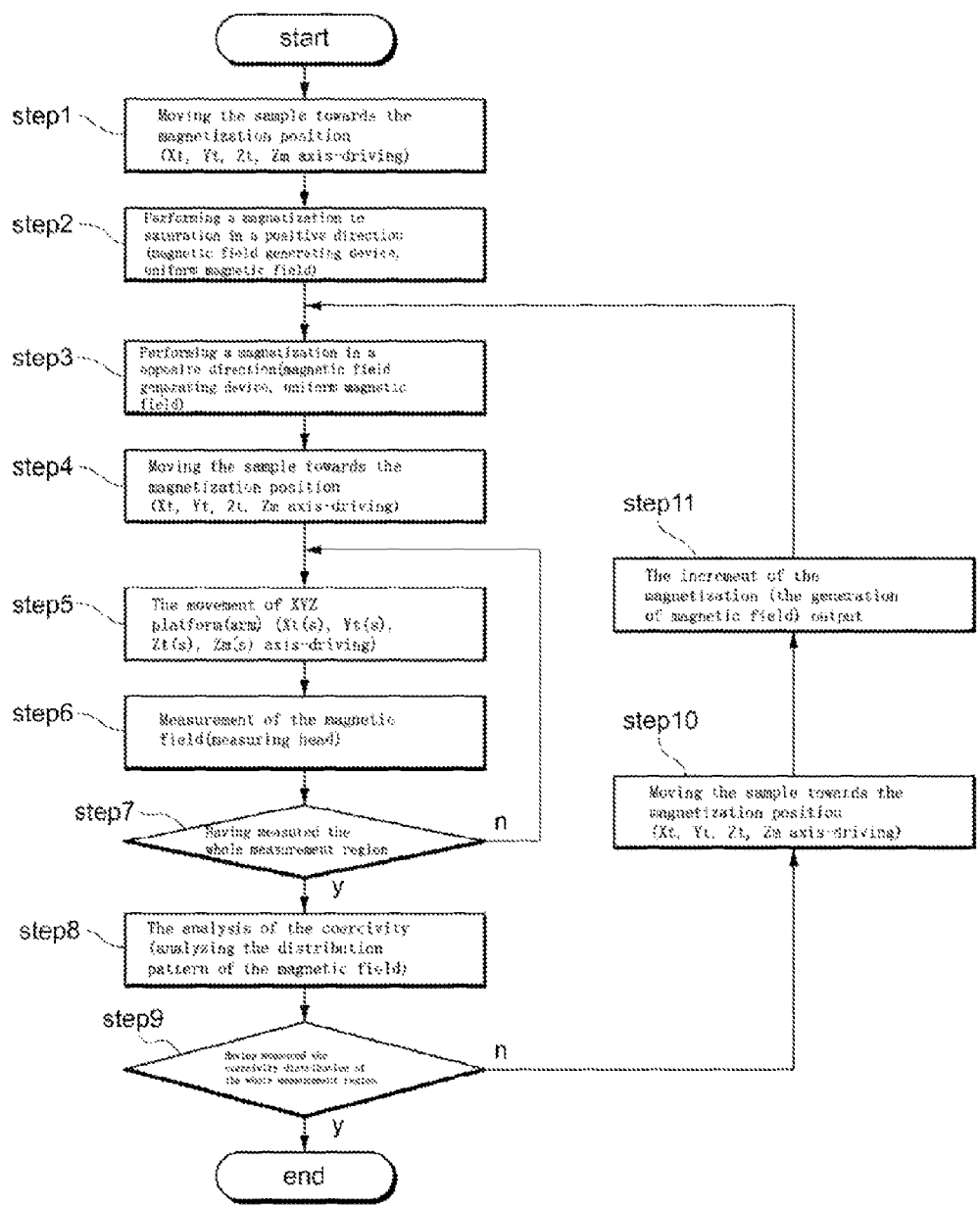
FIG. 2 is a flowchart showing the actions for measuring the coercivity distribution the magnetic sample.

FIG. 2 is as flowchart showing the actions for measuring the coercivity distribution of the magnetic sample 5. First of all, the magnetic sample 5 is moved towards the magnetization position (the position indicated by the dashed lines in FIG. 1) through the XYZ platform and the Zm axis-driving system (step 1). Then, the magnetic field generating device 6 radiates a magnetic field from the magnetic pole 7 to magnetize the magnetic sample 5 in a positive direction (such as the direction in which the top of the magnetic sample is the N pole) (step 2). At this time, the magnetic field radiated by the magnetic pole 7 is the one that has an intensity (for example 6400 kA/m) adequately to magnetize the magnetic sample 5 to saturation and is uniform without spatial distribution.

In step 3, the magnetic sample 5 is magnetized in a direction opposite to the magnetization direction in step 2. At this time, the magnetic field radiated by the magnetic pole 7 is a uniform one without spatial distribution. In addition, as the intensity of the magnetic field gradually increases to the level of the coercivity of the magnetic sample 5 while the repetition of magnetization and/or measurement is performed in the subsequent steps, the intensity may be set as a value lower than the predicted coercivity (for example, 160 kA/m). Thereafter, the magnetic sample 5 is moved towards the measurement position through the XYZ platform and the Zm axis-driving system (step 4).

The XYZ platform 10 is moved to change the relative position between the magnetic sample 5 and the measuring part 2 (step 5), and the magnetic field of the magnetic sample 5 is measured by the measuring part 2 (step 6). Further, the relative position between the magnetic sample 5 and the measuring part 2 may be changed via the XYZ arm 20. The movement performed by the XYZ platform 10 (the XYZ arm 20) and the measurement performed by the measuring part 2 are repeated until the whole measurement region is measured (step 7).

After the whole measurement region is measured, the measured distribution pattern of the magnetic flux leakage is analyzed by the control part 40, and the region showing the pattern present by applying a magnetic field equivalent to the coercivity to a thin plate magnetic sample, and the coercivity in this region is used as the intensity of the magnetic field applied in step 3 (step 8). The details of the pattern for the determination of the coercivity will be described later.

If it is not determined in step 9 that the measurement of the coercivity distribution has been completed in the whole measurement region, the magnetic sample 5 is moved to the magnetization position (the position indicated by the dashed lines in FIG. 1) through the XYZ platform and the Zm axis-driving system (step 10), and after the magnetization (generation of the magnetic field) output is increased (step 11), the processes of magnetization, measurement and analysis are repeated again (steps 3 to 8) is repeated again. In addition, the increment of the magnetization output may depend on the magnetic characteristics of the magnetic sample 5, and is a small value (for example, 160 kA/m) in a case where a sample has a high squareness and there are rapid changes around the level of the coercivity in the demagnetization curve.

Figure 3:
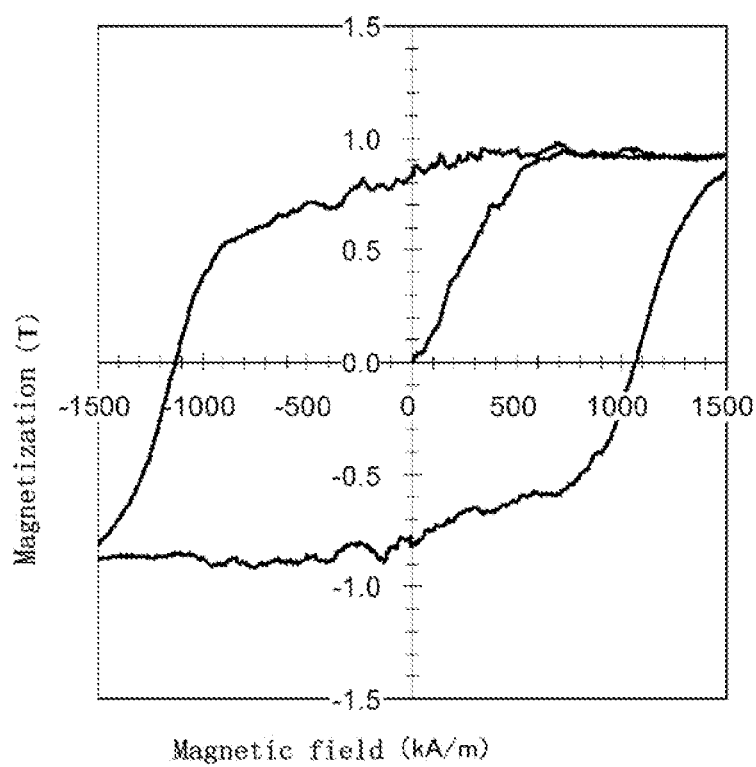
FIG. 3 is a curve of magnetization vs. magnetic field of the magnetic sample used in an example of the measurement of the coercivity distribution.

FIG. 3 is an exemplary curve of magnetization vs. magnetic field of the magnetic sample 5 which is used in the action for measuring the coercivity distribution. The magnetic sample 5 is an $Nd_2Fe_{14}B$ film prepared by the sputtering method with a size of 6 mm×6 mm and a thickness of 100 nm. The curve of magnetization vs. magnetic field is measured by a VSM with the magnetic field being applied perpendicular to the surface of the thin film sample.

It can be read from the curve of magnetization vs. magnetic field that the coercivity of the magnetic sample 5 is 1120 kA/m. That is, half of the magnetization in the magnetic sample 5 has been reversed in an external magnetic field of 1120 kA/m.

Figure 4:
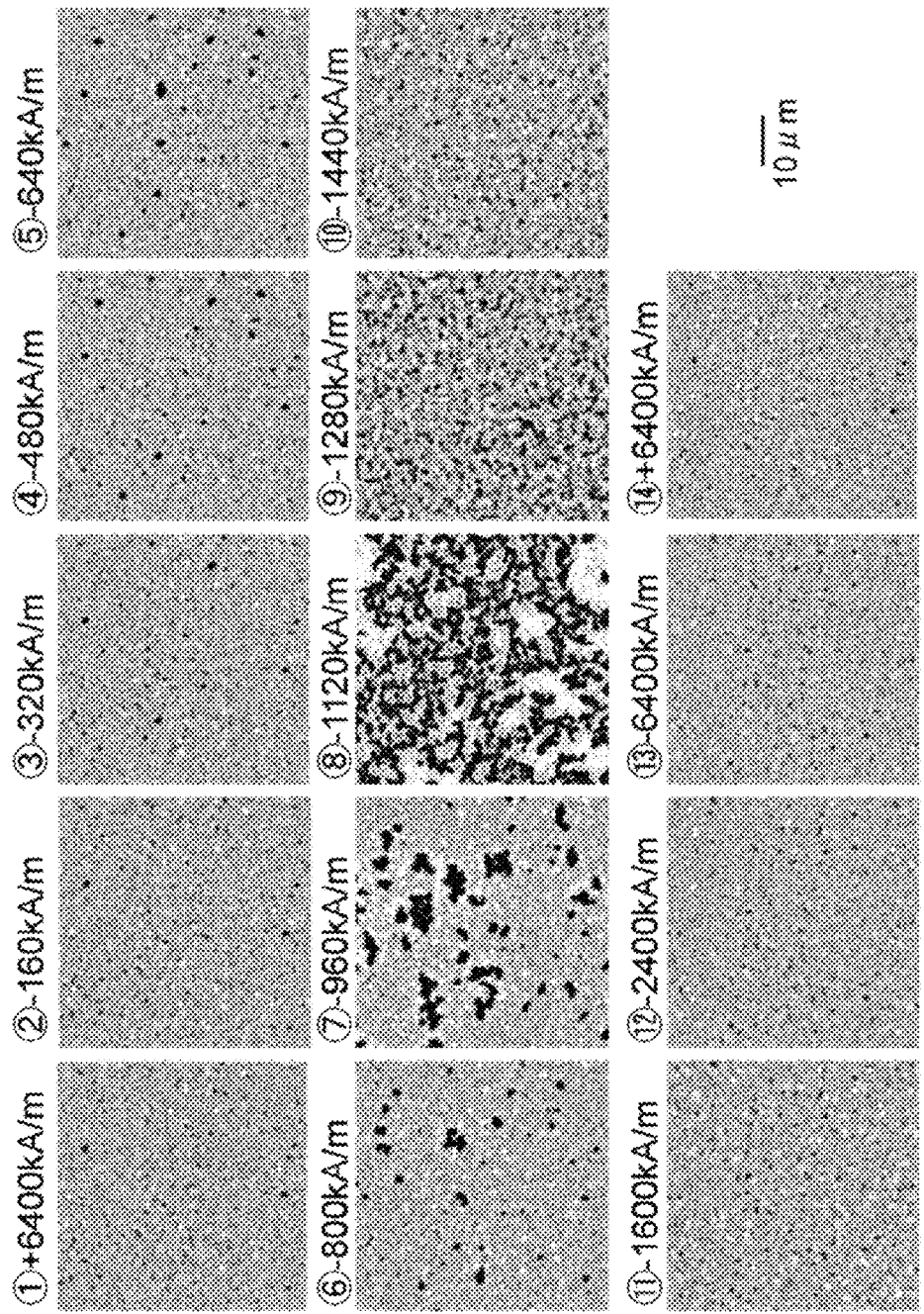
FIG. 4 is a view showing the distribution pattern of the magnetic flux leakage in the example of the measurement of the coercivity distribution in a magnetic sample.

FIG. 4 is an exemplary distribution pattern of the magnetic flux leakage in the magnetic sample 5 which is obtained by the action for measuring the coercivity distribution shown in the flowchart of FIG. 2. After a magnetic field of 6400 kA/m (6400 kA/m) is initially applied to the magnetic sample 5 in a positive direction, the distribution of the magnetic flux leakage on the surface of the sample is measured, and then, after a magnetic Field of 160 kA/m (160 kA/m) is applied in a negative direction, and the distribution of the magnetic flux leakage on the surface is measured. In addition, after the measurement is repeated while the magnetic field applied in the negative direction is increased to 1600 kA/m with 160 kA/m for each time, it is determined that the distribution of the magnetic flux leakage on the surface of the sample does not change under a large magnetic field (2400 kA/m or 6400 kA/m) applied in the negative direction. Finally, the sample applied with a magnetic field of 6400 kA/m in the positive direction is measured, and it is determined that the measurement region in the same state as the initial one is measured (6400 kA/m ).

Table 1 is the correlation between the average value of the magnetic flux leakage in the magnetic sample 5, which is obtained from the action for measuring the coercivity distribution shown in the flowchart of FIG. 2, and the applied magnetic field. Here, the average value of the magnetic flux leakage refers to the average of all the points in the FIG. with respect to the absolute value of the magnetic flux density obtained from each point (with a pinch of 0.1 μm in XY) shown in the distribution pattern of the magnetic flux leakage in the FIG. 4.

TABLE 1

| Applied magnetic field (kA/m) | Average value of magnetic flux leakage (mT) |
|---|---|
| 6400 | 8.58 |
| −160 | 9.63 |
| −320 | 9.44 |
| −480 | 9.07 |
| −640 | 8.77 |
| −800 | 8.56 |
| −960 | 9.62 |
| −1120 | 20.45 |
| −1280 | 16.61 |
| −1440 | 12.61 |
| −1600 | 10.31 |

TABLE 1-continued

| Applied magnetic field (kA/m) | Average value of magnetic flux leakage (mT) |
|---|---|
| −2400 | 8.61 |
| −6400 | 8.58 |

Regardless of whether the magnetic sample 5 is magnetized to saturation or not in a state where a magnetic field of 6400 kA/m (6400 kA/m) is applied in the positive direction, the measured magnetic flux leakage has a small average value. This is because the magnetic flux will not leak from the uniformly magnetized thin plate magnetic sample 5 due to the influence of the demagnetizing field Hd.

Moreover, the average value of the magnetic flux leakage in the magnetic sample 5 does not have a great change even in a state where a magnetic filed of 160 kA/m (160 kA/m) is applied in the negative direction. In addition, in a state where the magnetic field applied in the negative direction is increased and the magnetic sample 5 is applied with a magnetic field of 1120 kA/m in the negative direction (1120 kA/m), the average, value of the magnetic flux leakage will rapidly increase, to the maximum level. This is because almost half of the magnetization in the magnetic sample 5 is reversed and the demagnetizing factor Hd increased to the minimum level by applying a magnetic field with its intensity equivalent to the coercivity of the magnetic sample 5, thereby, the magnetic flux leaking to the outside from the magnetic sample 5 reaches the maximum level.

In a case of exceeding the level of the coercivity of the magnetic sample 5 and increasing the magnetic field applied in the negative direction, the average of the magnetic flux leakage will decrease in the measurement region. This is because the region in the magnetic sample 5 where the magnetization is reversed is enlarged and the demagnetizing factor is increased, thereby, the magnetic field leaking to the outside from the magnetic sample 5 decreases.

In the measurements mentioned above in which the magnetic field applied in the negative direction is gradually increased while repeated, the value obtained by adding the demagnetizing factor, the recoil permeability of the magnetic sample 5 or the like due to the shape of the sample to the applied magnetic field of 1120 kA/m under which the largest leakage magnetic field is observed is deemed as the coercivity of the magnetic sample 5. This result is consistent with the coercivity calculated from the curve of magnetization vs. magnetic field obtained by measuring the magnetic sample 5 using a VSM shown in FIG. 3.

What is claimed is:

1. A magnetic measurement device for measuring the coercivity of a magnetic sample, the magnetic measurement device comprising:
   a first magnetic field generating part which applies a magnetic field in a first direction to the magnetic sample and performs a magnetization to substantial saturation;
   a second magnetic field generating part which applies a magnetic field in a second direction to the magnetic sample and performs a demagnetization, the second direction being opposite to the first direction;
   a measuring part which measures the magnetic flux leakage due to the remanent magnetization of the magnetic sample demagnetized by the second magnetic field generating part, the measuring part measuring the magnetic flux leakage without a magnetic field being applied to the measuring part; and
   a coercivity determining part which controls the actions of the first magnetic field generating part, the second magnetic field generating part and the measuring part, obtains the magnetic flux leakages when the magnitude of the magnetic field in the second direction is changed sequentially, and outputs the coercivity of the magnetic sample based on the magnitude of the magnetic field when the magnetic flux leakage reaches a maximum level, the magnetic sample having a thin film shape.

2. The magnetic measurement device of claim 1, wherein the first magnetic field generating part also functions as the second magnetic field generating part.

3. The magnetic measurement device of claim 1, wherein the second magnetic field generating part applies a uniform magnetic field to the magnetic sample.

4. The magnetic measurement device of claim 1, wherein the coercivity of only a microregion of the magnetic sample is measured.

* * * * *